(12) United States Patent
Blanchard

(10) Patent No.: US 6,331,794 B1
(45) Date of Patent: Dec. 18, 2001

(54) PHASE LEG WITH DEPLETION-MODE DEVICE

(76) Inventor: Richard A. Blanchard, 10724 Mora Dr., Los Altos, CA (US) 94024

( * ) Notice: Subject to any disclaimer, the term of this patent is extended or adjusted under 35 U.S.C. 154(b) by 0 days.

(21) Appl. No.: 09/521,487

(22) Filed: Mar. 9, 2000

Related U.S. Application Data

(60) Provisional application No. 60/123,725, filed on Mar. 10, 1999.

(51) Int. Cl.[7] .............................. H03K 1/00; H03K 17/56
(52) U.S. Cl. ........................................... 327/112; 327/424
(58) Field of Search ..................................... 327/108, 111, 327/112, 423, 424, 427; 326/86, 87, 117

(56) References Cited

U.S. PATENT DOCUMENTS

| | | |
|---|---|---|
| 3,328,210 | 6/1967 | McCaldin et al. . |
| 4,004,170 | * 1/1977 | Henke . |
| 4,390,803 | * 6/1983 | Koike .................................... 327/108 |
| 4,774,196 | 9/1988 | Blanchard .............................. 437/24 |
| 4,789,798 | * 12/1988 | Lach ....................................... 326/69 |
| 4,799,100 | 1/1989 | Blanchard et al. ..................... 357/52 |
| 4,868,537 | 9/1989 | Blanchard .............................. 357/51 |
| 4,958,204 | 9/1990 | Blanchard et al. ..................... 357/22 |
| 4,978,631 | 12/1990 | Blanchard .............................. 437/24 |
| 5,592,108 | * 1/1997 | Tsukahara ............................. 326/117 |

FOREIGN PATENT DOCUMENTS 2028582   3/1980  (GB) .

OTHER PUBLICATIONS

"Trends in Power Semiconductor Devices" by B. Jayant Baliga (43 IEEE Transactions on Electron Devices 1717–1731, Oct. 1996).

Chapter 1 titled "Power Semiconductor Devices for Variable Frequency Drives" written by B. Jayant Baliga in Power Electronics and Variable Frequency Drives (ed. B. Bose 1996).

J.S. Ajit and D.M. Kinzer, "1200V, 150A Insulated–Gate Thyristors," Proceedings of 1995 International Symposium on Power Semiconductor Devices & I.C.s.

J.S. Ajit, "A New Three–Terminal Thyristor–Based High–Power Switching Configuration with High–Voltage Current Saturation," 18 IEEE Electron Device Letters, Jul. 1997.

"Drive Techniques for High Side N–channel MOSFETs" by Warren Schultz, *Power Conversion& Intelligent Motion*, Jun., 1987.

IR Application Note AN–978, available from the International Rectifier web site.

* cited by examiner

*Primary Examiner*—Toan Tran
(74) *Attorney, Agent, or Firm*—Richard K Robinson

(57) ABSTRACT

A technique for supplying drive voltage to the gate of a high-side depletion-mode N-channel MOS-device for phase-leg circuits, H-bridges, or any circuit with a depletion-mode N-channel MOS-device with its source at a voltage above local ground.

21 Claims, 9 Drawing Sheets

| $V_{IN}$ | $Q_4$ | $V_{GS(Q1')}$ | $Q_{1'}$ | $R_L$ CURRENT |
|---|---|---|---|---|
| -V | OFF | 0V | ON | $\dfrac{V_{CC} - V_{Q1'}}{R_L}$ |
| 0V | ON | ≈ -V | OFF | 0 |

| $V_{IN}$ | $Q_{15}$ | $Q_{1''}$ | $Q_3$ | $V_{D1}$ | $V_{G2}$ | $V_{G2} - V_{D1}$ | $R_L$ CURRENT |
|---|---|---|---|---|---|---|---|
| $-V$ | OFF | ON | ON | $V_{DD}$ | $V_{DD}$ | 0V | $(V_{DD} - V_{Q1''})$ |
| 0V | ON | OFF | OFF | ≈ 0V | ≈ $BV_{D1}$ | $BV_{D1}$ | 0 |

PHASE LEG WITH DEPLETION-MODE DEVICE

This application claims priority from provisional application 60/123,725, filed Mar. 10, 1999.

BACKGROUND AND SUMMARY OF THE INVENTION

The present invention relates to power drive circuits using active semiconductor devices.

Background: "MOS" Transistors

One of the basic types of transistors is the insulated-gate field-effect transistor, which is commonly also referred to as a "MOS" transistor or "MOSFET". In any MOS transistor, the voltage on the "gate" terminal controls the density of majority carriers (electrons or holes) in a semiconducting "channel" region which is part of the conduction path. By controlling the number of majority carriers in the channel, the flow of current from the "source" through the channel and to the "drain" is controlled. Thus a MOS transistor operates as a switch which is controlled (at least partially) by the voltage on its gate.

A "MOSFET" may be configured to be a lateral, vertical, or grooved vertical structure. There are four regions in a MOSFET: source, drain, body, and gate. The source is a region where carriers originate when current is flowing in the transistor in normal operating conditions. The drain is a region where the carriers terminate when current is flowing in the transistor in normal operating conditions. The body is a region whose surface is inverted to form a "channel" when carriers flow in the transistor in normal operating conditions. The gate is an electrode that covers the surface of the body region between the source and the drain regions, and controls the carrier flow between the source and the drain of the transistor in normal operating conditions.

Background: N-Channel versus P-Channel

MOSFETs can be either n-channel devices (in which the majority carriers are electrons) or p-channel devices (in which the majority carriers are holes). The relative performance of equivalent n-channel and p-channel MOSFETs is determined primarily by the "mobility" of the electrons and holes in the inverted "channel" region at the surface of the body region. Electrons generally have a higher mobility, so the resistance of an n-channel MOSFET is lower than a p-channel MOSFET with the same geometry. (For example, in silicon at room temperature the electron mobility is about 2 to 3 times the hole mobility, and the ratio of mobilities is even larger in gallium arsenide; but in some semiconductors, such as germanium or gallium phosphide, the hole mobility is more nearly equal to the electron mobility.

N-channel transistors also differ from P-channel transistors in some other ways which can be important for power devices. For example, the transient behavior at turn-on and turn-off can be slightly different. This difference can be important for power devices, where mismatch during turn-on (or during turn-off of an inductive load) may lead to disastrous side-effects. In any case, N-channel and P-channel MOS-gated devices rarely have the same switching characteristics for the same geometry.

Background: Overdrive

An N-channel MOS transistor begins to turn "on" when the gate voltage (measured with respect to source voltage) exceeds the threshold voltage ($V_T$). The amount by which the gate voltage exceeds the threshold voltage will be referred to as the "overdrive" voltage. As the overdrive voltage increases, the transistor passes more and more current, up to a "saturation" current value. If the gate voltage is increased further, the current increases much more slowly. However, with power transistors it is common to increase the gate voltage beyond the point where saturation occurs. This gate voltage increase is used to decrease the on-resistance of the transistor as much as possible.

Background: DMOS

A "DMOS" transistor is a particular type of MOS transistor which is commonly used for high-voltage applications. A DMOS device uses a short channel which is defined by differential diffusion, in combination with a drift region which is interposed between the channel and the drain. (The drift region helps to stand off high source-drain voltages when the channel has not been turned "on.") For high-power applications, one commonly used form is a vertical DMOS, as shown in FIG. 1. In the solid structure shown, majority carriers (electrons in this example) flow laterally from source regions 12 through channel regions 14 into drift regions 16, within which the carriers pass vertically to drain 18 on the backside of the semiconductor chip.

MOS-gated devices with their high input impedance were viewed as nearly ideal switches. However, it was the use of the DMOS structure to fabricate power transistors that began a period of significant development in MOS-gated power devices. This evolution is covered in several books and articles, such as "Trends in Power Semiconductor Devices" by B. Jayant Baliga (43 IEEE TRANSACTIONS ON ELECTRON DEVICES 1717–1731, October 1996); Chapter 1 titled "Power Semiconductor Devices for Variable Frequency Drives" written by B. Jayant Baliga in POWER ELECTRONICS AND VARIABLE FREQUENCY DRIVES (ed. B. Bose 1996); and POWER SEMICONDUCTOR DEVICES by B. Jayant Baliga (PWS Publishing Company, 1996). Other, newer MOS-gated power devices based on DMOS technology such as the insulated-gate thyristors or IGTH (J.S.Ajit and D.M. Kinzer, "1200V, 150A Insulated-Gate Thyristors," PROCEEDINGS OF 1995 INTERNATIONAL SYMPOSIUM ON POWER SEMICONDUCTOR DEVICES & I.C.s.) and the base open/short-controlled thyristor or BOSCHT have also been developed. (J.S. Ajit, "A New Three-Terminal Thyristor-Based High-Power Switching Configuration with High-Voltage Current Saturation," 18 IEEE ELECTRON DEVICE LETTERS, July 1997.)

Double-diffused MOS or DMOS transistors are MOSFETs with a structure that eliminates many of the on-resistance and voltage limitations of conventional MOSFETs. DMOS transistors use the difference in the diffusion of sequentially introduced body and source impurities from a common edge to determine the channel length. Control of both the channel length and the peak dopant concentration in the body are obtained, as in double-diffused bipolar technology, by control of the amount of dopant introduced at the body and source doping step, and by the subsequent diffusion cycle. A DMOS transistor differs from a conventional MOS transistor in two distinct ways:

1. Since the channel Length L is determined by the difference between two sequential diffusions moving in the same direction from a common point of origin, L can be reproducibly controlled to values in the 0.5-to 2-micrometer range.
2. The body region is more heavily doped than the N-drain region, resulting in a junction that depletes further into the drain region than into the body region when a reverse bias is placed across the drain-to-body junction. This difference allows significantly higher voltages to be placed across the body-to-drain junction without markedly affecting the electrical channel length of the transistor.

These two differences in device structure result in MOS transistors with both a short channel length and the ability to withstand high drain-to-source voltages due to the separation of the active or channel region of the device from the region of the device that sustains the drain-to-source voltage. The DMOS transistor structure is somewhat analogous to that used in double-diffused bipolar transistors for many years. (In bipolar transistors, a narrow, moderately doped base region controls device electrical characteristics. A lightly doped N-collector region is used to support applied potentials.)

A typical circuit application of DMOS is a half-bridge or "phase leg", shown in FIG. 2. The half-bridge uses two identical N-channel MOS transistors $Q_{1E}$ and $Q_{2E}$ in series, but with at most one of the transistors turned "on" at a time. The transistor between the more positive power supply terminal and the load is referred to as the "high-side" device.

Background: Depletion-Mode MOS Devices

An N-channel MOS transistor begins to conduct when its gate voltage (measured with respect to its source voltage) rises above a certain "threshold" voltage (which is determined by the composition, dopings, and dimensions of any particular device). If the threshold voltage is positive (as is normal), the transistor is normally "off", and is referred to as an "enhancement-mode" device. Most power MOS transistors have generally been enhancement mode (normally "off") devices.

However, if the threshold voltage of an N-channel transistor is below zero, the device is referred to as a "depletion-mode" device. In this case the transistor is at least partially "on" with a gate voltage of zero, and the gate voltage must be driven below zero to fully turn the transistor "off." An advantage of N-channel devices is that it is generally easier to generate a constant negative voltage than to generate a positive voltage that is referenced to the voltage present on the source (or equivalent terminal) of a high-side drive device.

In VLSI devices the threshold voltage is typically controlled by an ion implantation into the semiconductor material of the channel. However, researchers have demonstrated N-channel depletion-mode power transistors, in which the threshold voltage is shifted by an implant into the gate insulator. Even though the gate insulators in power MOS transistors are typically much thicker than in VLSI transistors, implantation into the gate insulator does work well in power MOS devices. See e.g. UK Patent 2,028,528, U.S. Pat. Nos. 3,328,210, 4,774,196, 4,799,100, 4,868,537, 4,958,204, 4,978,631, and U.S. patent application Ser. No. 06/771,444 "Method for Shifting the Threshold Voltage of DMOS Transistors (referenced in issued U.S. Pat. No. 4,978,631)" all of which are hereby incorporated by reference.

The degree of depletion obtained by implantation into the gate insulator is a function of the distance the permanently charged ions are above the gate dielectric-semiconductor interface and the original threshold voltage of the transistor. In an N-channel MOSFET with a gate dielectric consisting of $0.1 \times 10^{-6}$ meter of silicon dioxide, a cesium implant of $3.5 \times 10^{12}$ /cm$^2$ is sufficient to move the threshold voltage of a 600V MOSFET from plus 2–4 Volts to minus 6–8 Volts. This change in $V_T$ of approximately 10 Volts produces a DMOS transistor that is turned "on" by the permanently ionized impurities in the gate by 6–8 Volts. For the purposes of this disclosure, a transistor that is turned "on" using permanently charged ions by a voltage that is more than twice the unadjusted $V_T$ value will be referred to as being in "deep depletion."

Power DMOS transistors, whether discrete devices, incorporated in integrated circuits, or merged into discrete devices such as IGBTs, MCTs, IGTHs, have almost always been enhancement mode or normally "off" devices. In applications requiring a power switch in series with the load, but in a "low-side" configuration, N-channel power devices are suitable. However, several common power switching configurations (e.g. the high side switch, the half-bridge, and the H-bridge) place different requirements on the switch(es). Looking first at a high-side switch as shown in FIG. 3, an N-channel power MOS transistor (or alternatively a MOS-gated power device with a merged N-channel MOSFET) is the power device $Q_{NE}$. (The use of a P-channel power MOS transistor, or alternatively a MOS-gated power device with a merged P-channel MOSFET, is also possible, but the difference in device characteristics that result from the difference between the mobility of conduction electrons and holes, and/or the resulting cost premium that must be paid for P-channel or P-channel based MOS-gated power devices, often precludes their use.) On the other hand, the use of an N-channel MOS-gated power device (which includes N-channel MOSFETs as well as merged devices based on N-channel MOSFETs) in high-side switch configurations requires a gate voltage that is referenced to the voltage present on the source (or equivalent) terminal S (FIG. 3). If the voltage on the drain (or equivalent) terminal D is the highest voltage in the circuit, a drive voltage that is greater than the voltage on the drain (or equivalent) terminal is almost always needed to turn the switch "on". In a half-bridge, the requirements for driving a "high side" N-channel MOS-gated power device are extremely similar to those in a high side switch, as are the issues concerning P-channel devices. In addition, a P-channel device with characteristics that match those of the low-side N-channel device may not be available.

Background: "MOS-Gated" Power Devices

A wide variety of power semiconductor devices have been proposed. Many make use of voltage-controlled conduction in a channel region in combination with other mechanisms, and such devices, as well as MOS transistors, are collectively referred to herein as "MOS-gated" devices. One very simple example is the "IGBT", in which minority carriers are injected at the drain end of the channel to increase total current for a given flow of electrons. However, there are many other MOS-gated power devices (including MCTs, IGTHs, and many others), as described e.g. in B. J. Baliga, POWER SEMICONDUCTOR DEVICES (1995), which is hereby incorporated by reference.

Background: High-Side Switching

A high-side switch, where the switch is between the more positive power supply terminal and the load, is required in many applications. One such application is motor switching. From a circuit design perspective, a P-channel device would be easiest to drive and a logical choice for high-side switches. However, N-channel devices are generally used because they have better transconductance and therefore are smaller in area than P-channel devices. Unfortunately, N-channel devices, when operated in the common-drain configuration, may require a gate voltage that is greater than the supply voltage. If the voltage on the drain (or equivalent) terminal is the highest voltage in the circuit, a drive voltage that is greater than the voltage on the drain (or equivalent) terminal is usually needed to turn the switch "on." This requires use of a charge pump, additional voltage supply, bootstrap techniques, or other scheme to create the necessary voltage. FIG. 3 shows an example of prior art high-side switching with an N-channel enhancement device $Q_{NE}$ and a charge pump CP. The charge pump CP is required to create a gate drive voltage for $Q_{NE}$ that is higher than the +VCC supplied to the drain of $Q_{NE}$.

Various drive techniques for high side n-channel MOS-gated power devices have been developed. These techniques include charge pumps, independent high-side power supplies, and bootstrap techniques (see "Drive Techniques for High Side N-channel MOSFETs" by Warren Schultz, *Power Conversion & Intelligent Motion,* June, 1987, which is hereby incorporated by reference.) The document "INT 978," hereby incorporated by reference, available from the International Rectifier web site discusses the gate drive requirements of high-sided MOS-gated devices. Table 1 in INT 978 discusses the following five gate drive methods: Floating Gate Drive Supply, Pulse Transformer, Charge Pump, Bootstrap, and Carrier Drive.

Background: H-Bridge (Full-Bridge) Switches

An H-bridge, also known as a full-bridge, consists of two phase-legs, A and B, with a load between the legs, as shown in FIGS. 4A and 4B. The input is usually a fixed DC voltage. The output is a voltage that can be controlled in magnitude and polarity. Typically, each leg consists of two switches and their antiparallel diodes. The two switches in each leg are switched in such a manner that when one of them is "on," the other is "off." In practice, both switches generally are "off" for a short interval, known as the blanking time. Otherwise, inadvertent on-time overlap in a phase-leg's high-side and low-side switches might result in an effective short circuit that can allow "shoot-through" current that may damage the switches.

If the switches in each leg are driven so that both the switches are not "off" simultaneously, then current will flow to the load continuously. The output voltage of each leg depends only on its input voltage and switch duty cycle. Therefore, with a constant input voltage, the voltage to the load is dictated by the status of the phase-leg switches.

Phase Leg (Half-Bridge) with Depletion-Mode Device

The presently preferred embodiment incorporates a depletion-mode n-channel MOS-gated device as a high-side switch in a phase leg. The depletion-mode N-channel MOS-gated switch has its threshold voltage shifted so it is fully "on" with a gate-to-source voltage of zero volts. The use of normally "on" MOS-gated devices allows the use of a negative switching voltage that is referenced to the voltage on the source of the low-side switch.

To keep the bottom switch "off" during start-up or power interruptions, two techniques are: (1) place a resistor between the gate and the source of the bottom device; or (2) as seen in one embodiment of this invention shown in FIG. 5, place a low voltage normally "on" device such as a JFET or depletion mode MOSFET $Q_{3D}$ between the bottom switch's gate and source, with the gate tied to the negative reference voltage. The device is "on" when no power is present, keeping the gate and source tied together.

During normal operation, the timing of the drive signals to the top and bottom devices guarantees that no shoot through can occur.

The MOS-gated high-side switch described herein can be used in any high-side switch application. Typical applications include high-side switches in automotive and similar applications. The leg of an H-bridge described herein can be used in any conventional H-bridge application which includes motor drives, power supplies, and driving lamps in lighting applications.

The disclosed innovations, in various embodiments, provide one or more of at least the following advantages:

high-side semiconductor switching without driver charge pumps, independent high-side power supplies, or bootstrap techniques phase-leg switch elements which have substantially identical diffusion structures and geometries and require little or no tweaking for matching, resulting in essentially identical electrical characteristics (except for $V_T$)

all switches can be integrated onto an IC if the voltage capability of the IC technology exceeds the peak voltage negative voltage control of the high-side switch active control of the high-side and low-side switch protection against shoot through during power-up all switches may be switched directly, allowing controllers or microprocessors to determine the states of both the high-side and low-side switches

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation). Other circuits and devices may enjoy the benefits of this invention without the use or application of the details of the preferred embodiment.

High-side Switch Incorporating an N-channel Depletion-mode Mos-gated Switch

Figure 1:
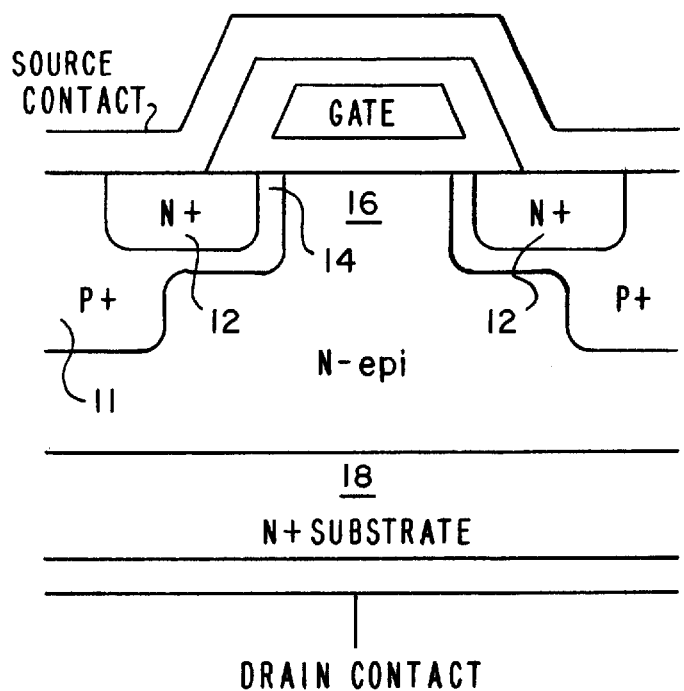
FIG. 1 shows a cross section of a typical N-channel vertical DMOS transistor.
Figure 3:
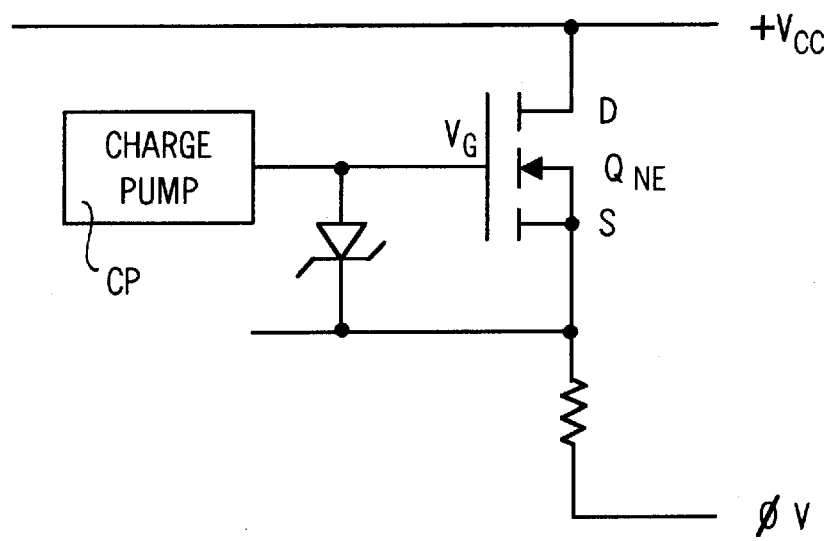
FIG. 3 depicts a circuit with an N-channel enhancement-mode MOS transistor used as a high-side switch and a charge pump to drive its gate.
Figure 2:
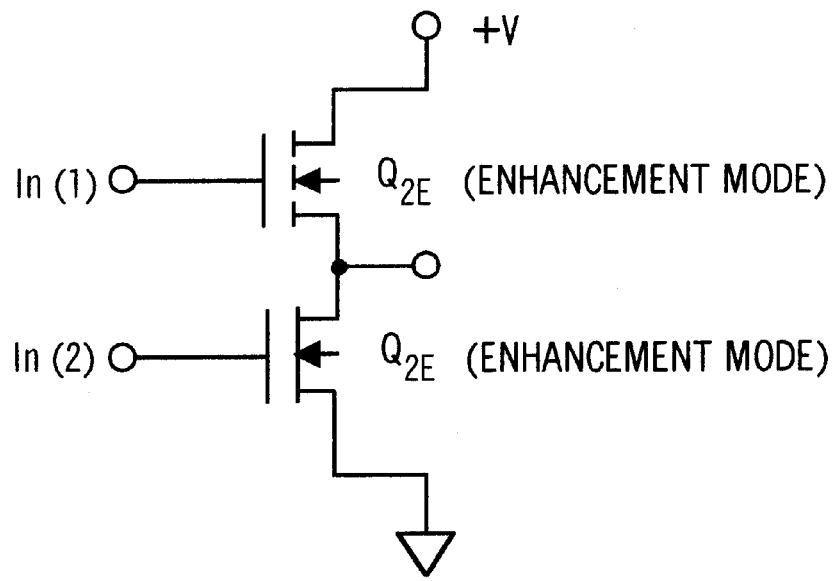
FIG. 2 shows two N-channel enhancement-mode MOS transistors in a half-bridge.
Figure 5:
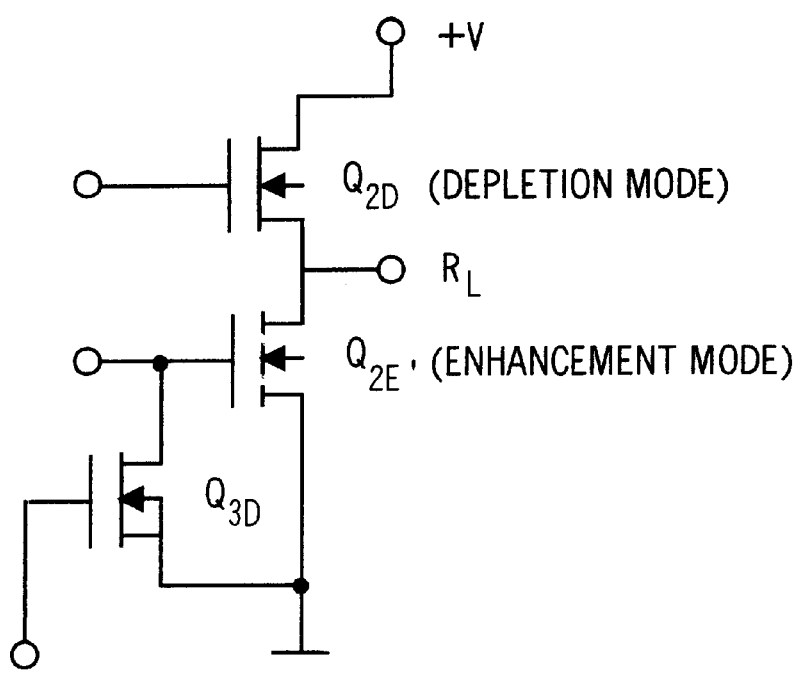
FIG. 5 depicts a phase-leg incorporating a high-side N-channel depletion mode MOS device and an N-channel depletion mode device between the source and the drain of the low-side switch.
Figure 4A:
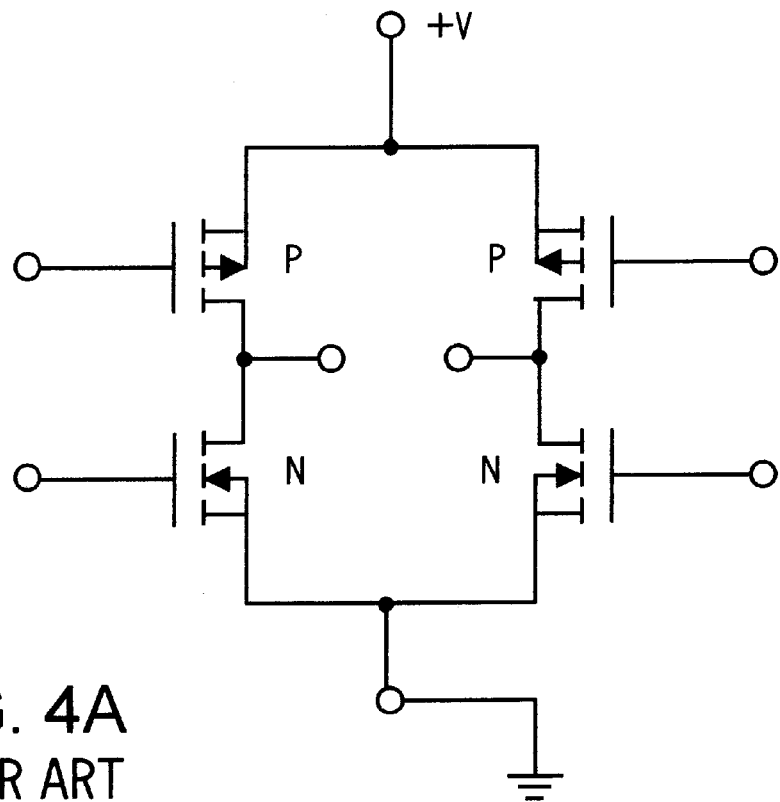
FIG. 4A shows two N-channel and two P-channel MOS transistors in an H-bridge configuration.
Figure 4B:
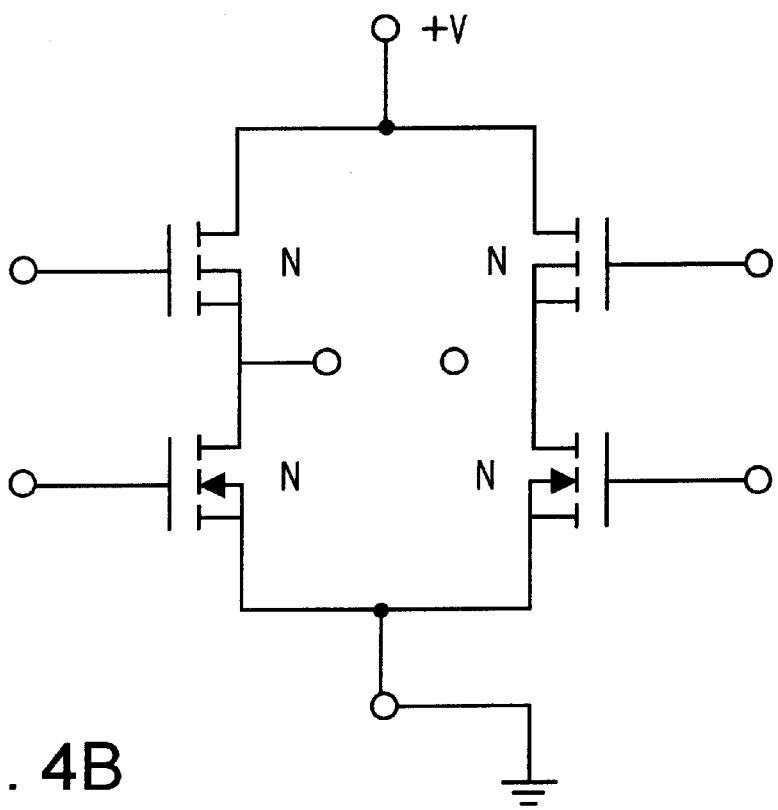
FIG. 4B shows four N-channel MOS transistors in an H-bridge configuration.

A presently preferred embodiment of a phase-leg incorporating high-side N-channel depletion-mode MOS devices is shown in FIG. 5. $Q_{1D}$, the high side driver, is the normally "on" (depletion mode) N-channel MOS-gated device with a source voltage above ground. A negative gate-to-source voltage is used to turn off $Q_{1D}$. Transistor $Q_{2E}$ is an enhancement-mode transistor, and provides the low-side driver. ($Q_3$ provides auxiliary gate drive for depletion-mode transistor $Q_2$, and ensures that $Q_2$ will be biased on at startup.)

Figures 6, 7:
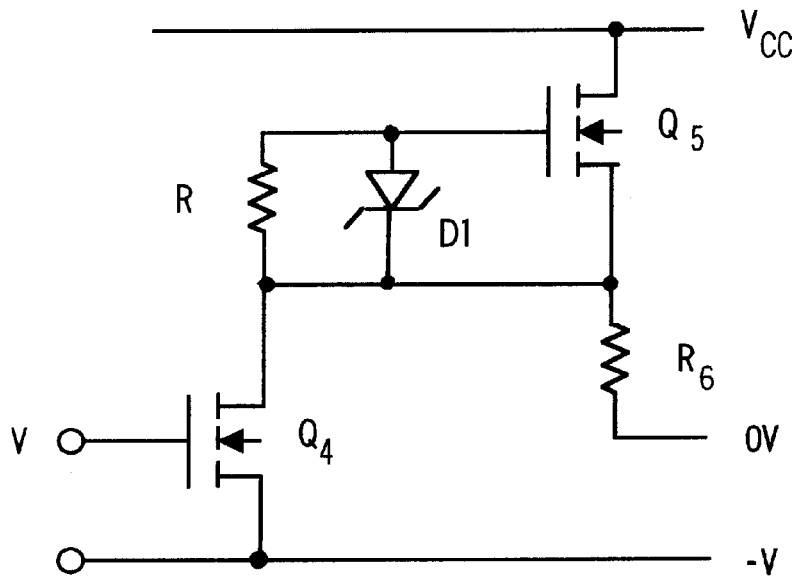
FIG. 6 shows a high-side switch incorporating an N-channel depletion-mode MOS-gated device.
FIG. 7 shows the operation of the circuit of FIG. 6.

FIG. 6 shows a high-side switch using a depletion-mode pull-up device, and also shows how additional components can be used to drive the pull-up device. In this example a transistor $Q_4$ drives pull-up transistor $Q_{1'}$, and diode D1 protects the gate oxide. D1 is a Zener diode with a breakdown voltage ($BV_{D1}$) larger than the voltage required to bias $Q_{1'}$"off," but with a breakdown voltage well below the gate-to-source breakdown voltage of $Q_{1'}$. R is a resistor that provides a current flow path between the source and gate of $Q_{1'}$. The voltage "−V" is a negative voltage sufficiently large to turn $Q_{1'}$"off" when $Q_2$ is turned "on. " $R_L$ is a load resistance. In this embodiment, resistor R and the gate capacitance of $Q_{1'}$determine the turn-on speed of $Q_{1'}$ when its gate voltage is switched from −V to 0V. This circuit turns "off" rapidly, but its turn-on speed can be hindered by the value of resistor R and the gate capacitance of $Q_{1'}$. The circuit operates as shown in the table of FIG. 7.

Figures 8, 9:
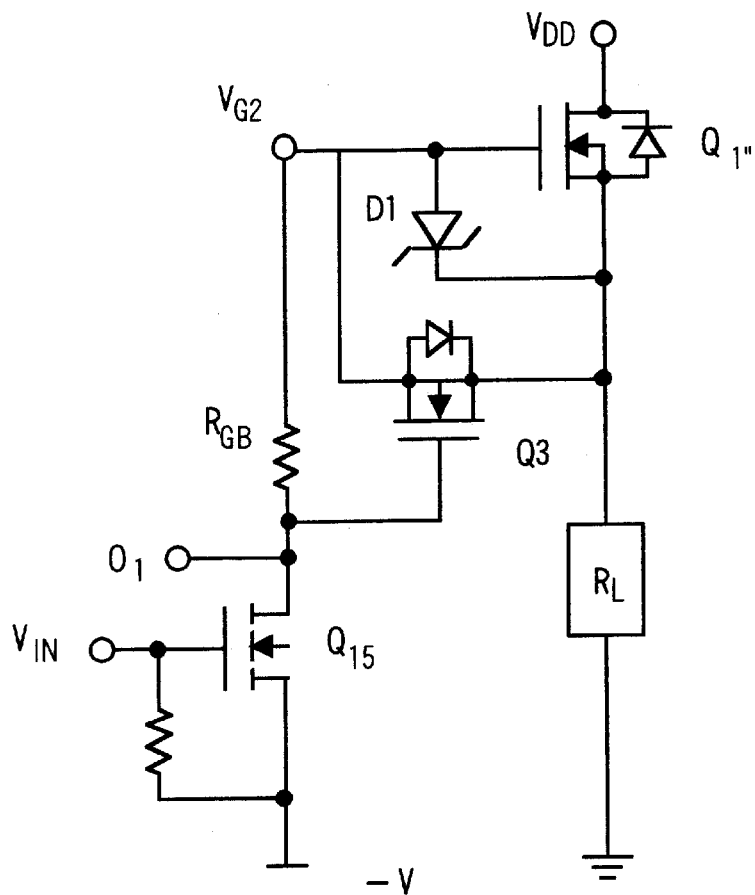
FIG. 8 depicts a high-side switch incorporating an N-channel depletion-mode MOS-gated device with a circuit for more rapid gate turn-off.
FIG. 9 shows the operation of the circuit of FIG. 8.

The turn-on speed of high-side N-channel depletion-mode MOS devices such as shown in FIG. 5 can be increased by using a current source, as shown in FIG. 8. The embodiment shown in FIG. 8 is a high-side switch, but the technique is also applicable to phase-legs. Resistor R between the gate and source of $Q_{1''}$is replaced by a normally "on" MOS-gated device with a threshold voltage typically between 0V and −10V. $R_{GB}$ provides the gate-to-source voltage to bias $Q_3$ "on" or "off." As $Q_{15}$ makes the transition from "off" to "on," $Q_3$ provides the current for a rapid transition. The circuit operates as shown in the table of FIG. 9.

Generally, the included tables give specific values for some of the voltage and timing parameters just referred to, as used in the specific context of the presently preferred embodiment. It must be understood that these specific values are given merely to provide a wealth of detail regarding the preferred embodiment, and for better understanding of FIGS. 5, 6, and 8, and do not by any means delimit necessary features of the invention.

H-bridge Incorporating High-side N-channel Depletion-mode Mosgated Switches

Figure 10:
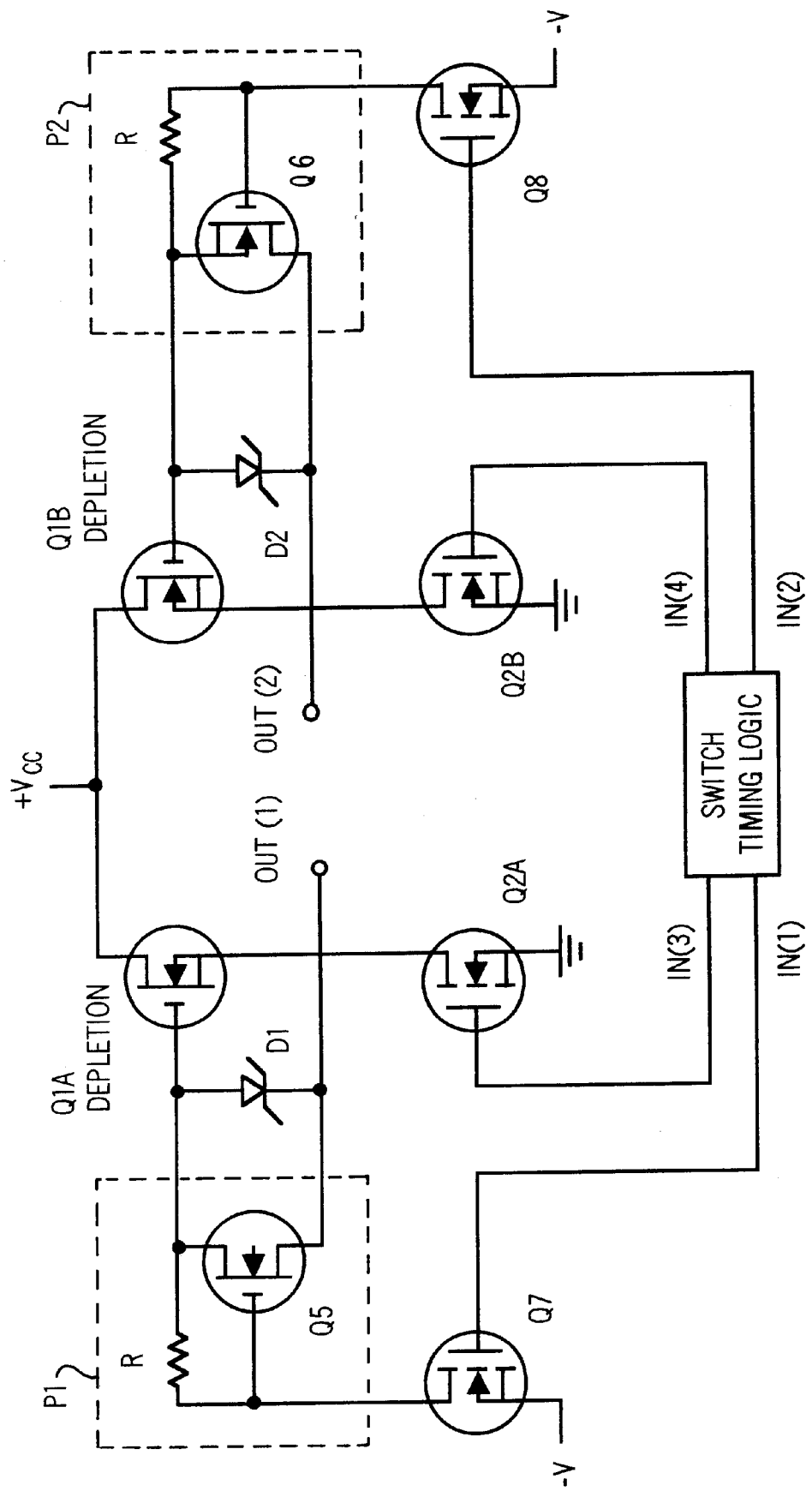
FIG. 10 shows a diagram of an embodiment of an H-bridge incorporating high-side depletion-mode MOS-gated switches.
Figure 11:
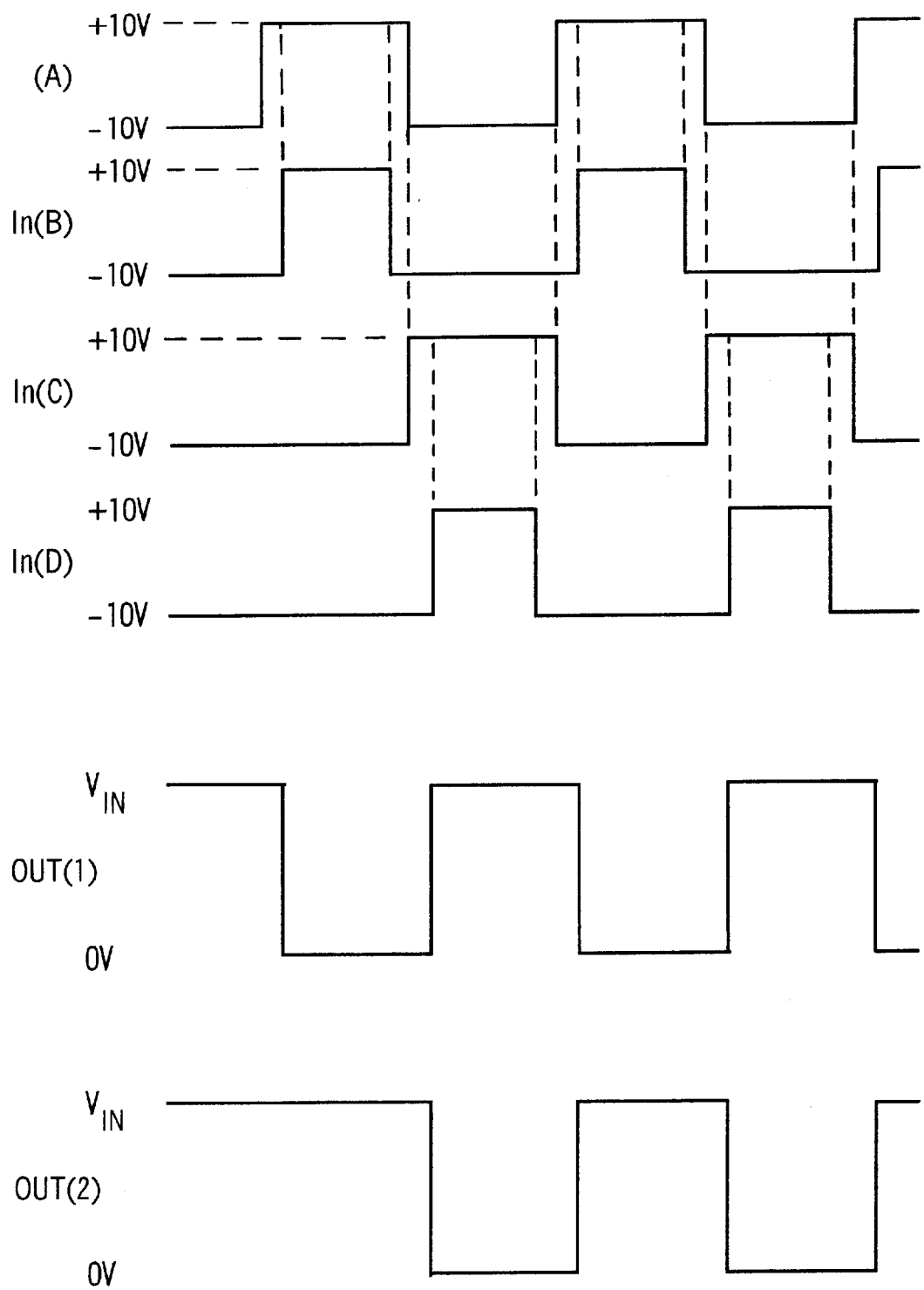
FIG. 11 shows the operation of the circuit of FIG. 10.

FIG. 10 shows a diagram of an embodiment of an H-bridge incorporating depletion-mode devices. The bridge selectably supplies current from supply +VCC to output terminals OUT(1) and OUT(2). $Q_{1A}$ and $Q_{1B}$ are the high-side depletion-mode devices. $Q_{2A}$ and $Q_{2B}$ are the low-side enhancement mode devices. The bridge is switched by input signals In(1), In(2), In(3), and In(4) as shown by the timing diagrams of FIG. 11.

Figure 12:
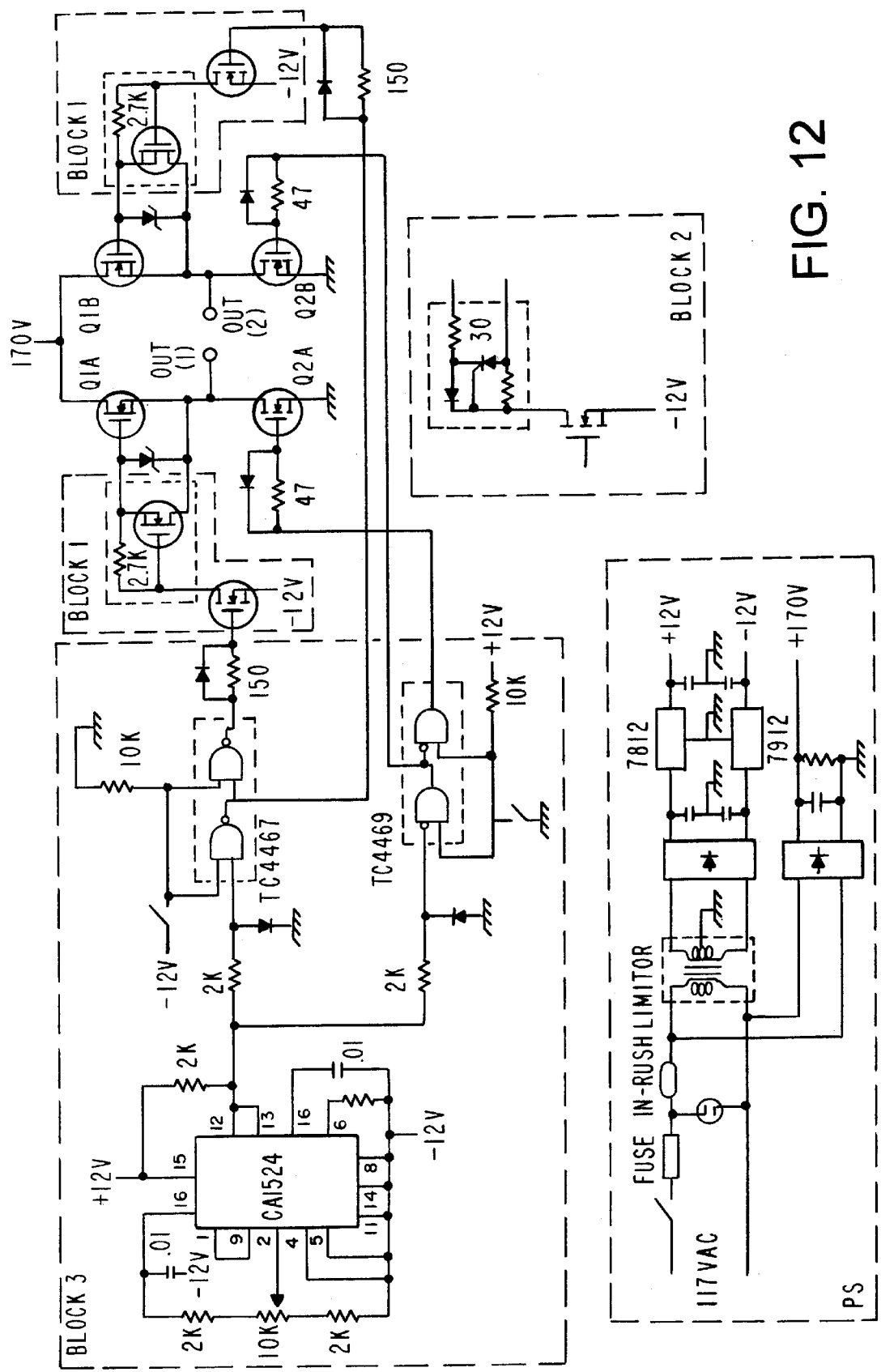
FIG. 12 shows a diagram of another embodiment of an H-bridge incorporating high-side depletion-mode MOS-gated switches.

A circuit diagram of the presently preferred embodiment of an H-bridge incorporating high-side depletion-mode devices and speed enhancement circuitry is shown in FIG. 12. A power supply PS creates +12 Volt, −12 Volt, and +170 Volt outputs. The +12 Volts is used to switch the PMOS transistors $Q_{2A}$, $Q_{2B}$. The −12 Volts is used to switch the NMOS high-side transistors $Q_{1A}$, $Q_{1B}$. The H-bridge switchably drives a load such as a motor with the 170 Volts.

The circuit of Block 1 supplies the negative voltage needed to turn off the high-side NDMOS transistors. An alternate embodiment of the circuit of Block 1 is shown in Block 2. Switch Timing Logic Block 3 controls the H-bridge switch timing, insuring that the correct high-side and low-side switches are on at the appropriate time to supply current to the load while avoiding having both on at the same time in the same leg.

Figure 13:
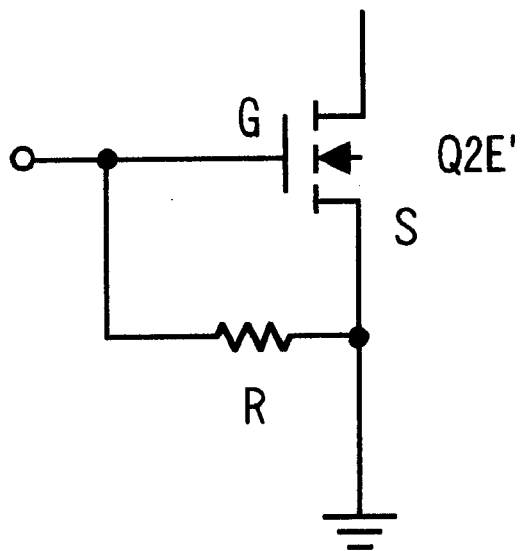
FIG. 13 shows a resistor to keep the bottom switch "off" during start-up or power interruptions.
Figure 14:
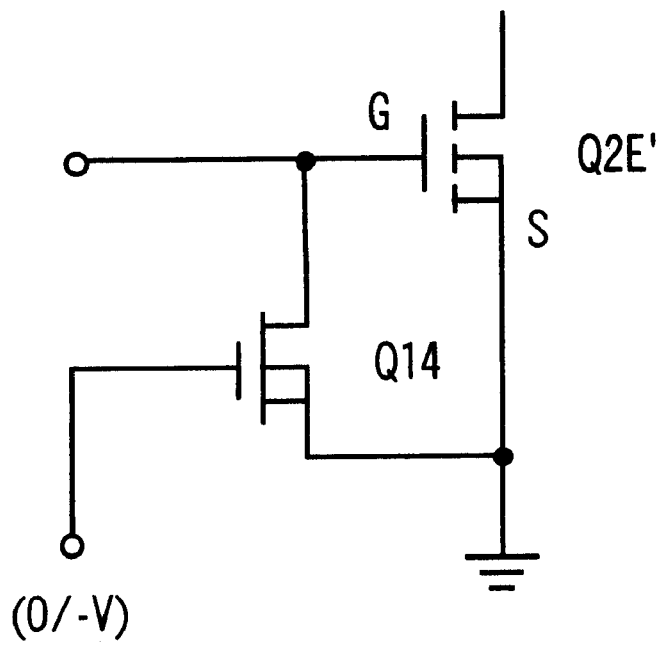
FIG. 14 shows a normally "on" device to keep the bottom switch "off" during start-up or power interruptions.

To keep the bottom switch "off" during start-up or power interruptions, one technique is shown in FIG. 13, where a resistor R is placed between the gate G and the source S of the bottom device $Q_{2F}$; another technique is seen in FIG. 14, where a low voltage normally "on" device such as a JFET or depletion mode MOSFET $Q_{14}$ is placed between the bottom switch's gate G and source S, with the gate of $Q_{2E''}$tied to the negative reference voltage (−10V). The device is "on" when no power is present, keeping the gate and source tied together.

Integration of the Phase-Leg or H-Bridge in a Single I.C.

The components in FIGS. 5, 6, 8, 10, 13, and 14, as well as the bridge and the majority of the devices in FIG. 12 can be integrated onto a single piece of silicon (as long as the peak voltage that will be present does not exceed the voltage that the silicon can withstand). This feature means that both the power switches and the sense and control circuits can be fabricated simultaneously, taking advantage of the economic and other aspects of IC technology.

According to a disclosed class of innovative embodiments, there is provided: A circuit comprising: first and second drive elements, connected to selectably pull a load node toward first and second reference voltages respectively; said first drive element comprising a depletion-mode power device, which is always in its "on" state whenever any voltage between said first and second reference voltages is applied to a gate terminal thereof.

According to another disclosed class of innovative embodiments, there is provided: A circuit comprising: first and second power semiconductor drive elements, connected to selectably pull a load node toward first and second reference voltages respectively; said first drive element being a depletion-mode device, and said second drive element being an enhancement-mode device.

According to another disclosed class of innovative embodiments, there is provided: A circuit comprising: first and second power semiconductor drive elements, connected to selectably pull a load node toward first and second reference voltages respectively; said first and second drive elements having substantially identical diffusion structures; said first drive element being a depletion-mode device, and said second drive element being an enhancement-mode device.

According to another disclosed class of innovative embodiments, there is provided: A bridge circuit comprising: a first phase leg, connected to selectably source current from a positive reference voltage to a load device; and a second phase leg, connected to selectably source current from said positive reference voltage to said load device; said first phase leg comprising a high-side switch and a low-side switch, wherein said high-side switch is an N-channel depletion-mode power device; and said second phase leg comprising a high-side switch and a low-side switch, wherein said high-side switch is an N-channel depletion-mode power device.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

Body: The material within which a transistor channel is formed.

Carrier: In a semiconductor, an electron or hole, which can move around in the semiconductor material to transport charge. The movement of carriers is how electrical current flows.

Depletion: Reduction of carrier density, in a volume of semiconductor material, due to applied voltage.

Depletion Mode: An active semiconductor device that is normally "on" with no control signal present.

Diffusion: The process of diffusion is the spontaneous movement of dopant or impurity atoms through a semiconductor, at a rate which depends on temperature and on the particular elements involved. The noun "diffusion" usually refers to a doped portion of a semiconductor material.

Diffusion Barrier: A material in which impurities have a low diffusion constant. For example, titanium nitride is often used as a conductive diffusion barrier material in silicon integrated circuit technology.

Diode: A two-terminal device. Typically a diode is rectifying, i.e. passes current in only one direction. A rectifying diode may be implemented, for example, by a P-N junction in a semiconductor material.

Dopant: An atom added to a semiconductor, which, when activated, provides a "carrier"(i.e. an electron or hole) which can move around in the semiconductor to enable the flow of current. For example, in silicon technology, boron or gallium can act as P-type dopants (or "acceptors"), and phosphorus, arsenic, or antimony can act as N-type dopants (or "donors").

Drain: The region where the carriers terminate when current is flowing in the transistor in normal operating conditions.

Drift Region: In a DMOS transistor, the semiconductor region between the channel and drain.

Drive Element: Any active semiconductor device.

Enhancement Mode: An N-channel MOS transistor begins to conduct when its gate voltage rises above a certain "threshold" voltage (which is determined by the compositions and dimensions of any particular device). If the threshold voltage is positive, the transistor is normally "off", and is referred to as an "enhancement-mode" device.

Field-Effect Transistor (FET): A transistor in which the voltage on a gate terminal controls the density of majority carriers in a semiconducting channel region which is part of the conduction path.

Gate: In a field-effect transistor, the electrode to which a control voltage is applied to modulate the conduction of the transistor.

Gate Terminal: A control lead to a semiconductor device.

High-side Switch: A switch that is between the more positive power supply terminal and the load.

Junction: An interface between p-type and n-type semiconductor material.

Load Node: A point in a circuit where an electronic load may be connected.

MOSFET: An insulated-gate field-effect transistor. A MOSFET may be configured to be a lateral, vertical, or grooved vertical structure. A MOSFET generally has four regions: source, drain, gate, and body. A MOSFET operates as a switch which is controlled (at least partially) by the voltage on its gate.

N-channel: A channel of n-type semiconductor material induced in a FET as a result of a bias applied to the gate. This channel allows current to flow from the drain to the source of an NMOS transistor. Typically an N-type channel is formed by surface inversion of p-type material, but it may also be formed by surface enhancement of n-type material.

N-type: A volume of semiconductor which normally includes an excess of electrons. This can be achieved by introduction of "donor" dopants (such as phosphorus, arsenic, or antimony in silicon).

"On" state: a state in a semiconductor device wherein there is conduction between an input terminal such as a drain, and an output terminal such as a source.

"Off" state: a state in a semiconductor device wherein there is little conduction between an input terminal such as a drain, and an output terminal such as a source.

P-channel: A channel of p-type semiconductor material induced in a FET as a result of a bias applied to the gate. This channel allows holes to flow from the source to the drain of a PMOS transistor.

P-type: A volume of semiconductor which normally includes an excess of holes. This can be achieved by introduction of "acceptor" dopants (such as boron or gallium in silicon).

Phase Leg (also commonly known as a half-bridge): a subcircuit having a pull-up device and a pull-down device connected to drive an output node in opposite directions.

PMOS: A p-channel field effect transistor, or a circuit or chip containing this type of transistor.

Reference Voltage: A substantially constant voltage such as a power supply voltage, any power rail, a constant voltage from a diode or a band gap regulator, or ground.

Resistivity: A measure of the resistance of a given material. Units are ohms times length.

Semiconductor: A material which is less conductive than a metallic material, but more conductive than an insulator. (More precisely, a semiconductor will have a nonzero "bandgap" between its valence and conduction bands, which is no more than a few electron volts at the very most.) The most frequently used semiconductor material is silicon, but there are many others, including gallium arsenide (or "GaAs"), silicon-germanium, mercury cadmium telluride, indium phosphide, gallium-indium arsenide-phosphide, and silicon carbide.

Sheet Resistance: The resistance of a square resistor, made from a given thin-film material, which has contacts on two opposite sides.

Source: The region where carriers originate when current is flowing in the transistor in normal operating conditions.

Threshold Voltage: The voltage at which a transistor starts to turn "on."

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, hybrid switches that are not constructed entirely of MOS (such as an IGBT) might be substituted for MOS devices where appropriate.

As another example, to reduce the number of external components, the depletion mode device such as Q3 (or its equivalent) in FIG. 8 may be integrated into the structure of the normally "on" DMOS high-side switch Q1.

While the majority of the circuits discussed in this disclosure describe normally "on" N-channel DMOS FETs, other MOS-gated devices such as IGBTs, MCTs, and other devices can be manufactured with normally "on" characteristics and can be used in these circuits.

Though N-channel normally "on" MOS-gated devices are described in this disclosure, it is possible to manufacture normally "on" P-channel MOS-gated devices.

Although the present invention may be implemented in a DMOS process, important aspects of this invention may also be obtained without DMOS process techniques, as long as the process uses a MOS gate. Even though the "M" in MOS originally referred to "Metal," those of ordinary skill in the art understand that the gate may be constructed of any conducting material. In a similar fashion, the "O" in MOS originally stood for oxide. Those of ordinary skill in the art know that this "O" layer may be any insulator above the channel region.

The following background publications provide additional detail regarding possible implementations of the disclosed embodiments, and of modifications and variations thereof. All of these publications are hereby incorporated by reference: B. Jayant Baliga, "Trends in Power Semiconductor Devices", 43 IEEE Transactions on Electron Devices, Vol. 43, No. 10, October, 1996; Bismal K. Bose, Power Electronics and Variable Frequency Drives, IEEE Press, 1996; David Bruce, Modern Electronics, Reston Publishing, 1984; Thomas M Frederiksen, Intuitive IC Electronics, McGraw-Hill, 1989; Mohan et al., Power Electronics, John-Wiley and Sons, 1995.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A circuit comprising:
   a first reference voltage connected to a first drive element;
   a second reference voltage connected to a second drive element;
   a third reference voltage having a polarity opposite that of the first reference voltage;
   a switch having a first terminal connected to the third reference voltage and a second terminal connected to a gate of the first drive element;
   the first and second drive elements connected to a load node to selectably pull said load node toward first and second reference voltages respectively, said load node having a third voltage;
   said first drive element comprising a depletion-mode power device, which is in its "off" state whenever the third reference voltage is applied to the gate terminal via the switch.

2. The circuit of claim 1, wherein said first drive element is DMOS.

3. The circuit of claim 1, wherein said first drive element is an N-channel depletion-mode device.

4. The circuit of claim 1, wherein said first drive element and said second drive element are integrated on a single die.

5. The circuit of claim 1, wherein said first drive element and second drive element are fabricated simultaneously using substantially the same process steps.

6. The circuit of claim 1, wherein said first drive element and second drive element are incorporated in a single integrated circuit.

7. A circuit comprising:
   a first reference voltage connected to a first drive element;
   a second reference voltage connected to a second drive element;
   the first and second drive elements being connected to a load node to selectable pull said load node toward first and second reference voltages respectively, said load node having a third voltage;
   said first drive element being a depletion-mode device, and said second drive element comprises an enhancement-mode device and a resistor connected between a source terminal and a gate terminal of the enhancement-mode device.

8. The circuit of claim 7, wherein said first drive element is DMOS.

9. The circuit of claim 7, wherein said first and second drive elements are incorporated in a single integrated circuit.

10. The circuit of claim 7, wherein said first drive element is an N-channel depletion-mode device.

11. A circuit comprising:
    first reference voltage connected to a first drive element;
    second reference voltage connected to a second drive element;
    the first and second drive elements connected to a load node to selectably pull said load node toward first and second reference voltages respectively, said load node having a third voltage;
    said first and second drive elements having substantially identical diffusion structures;
    said first drive element being a depletion-mode device, and said second drive element comprising an enhancement-mode device and a second depletion-mode device with a drain terminal connected to a gate terminal of the enhancement-mode device and a first source terminal connected to a source terminal of the enhancement-mode device.

12. The circuit of claim 11, wherein said first drive element and the enhancement-mode device have substantially identical doping concentrations and device geometries.

13. The circuit of claim 11, wherein said first and second drive elements comprise a phase-leg.

14. The circuit of claim 11, wherein said first and second drive elements are incorporated in a single integrated circuit.

15. The circuit of claim 11, wherein said first drive element is fully turned off only when a threshold voltage which is outside of the range of said first reference voltage and said third voltage is applied to the gate of said first drive element.

16. The circuit of claim 11, wherein said first drive element is DMOS.

17. A bridge circuit comprising:
    a first phase leg, connected to selectably source current from a positive reference voltage to a load device; and
    a second phase-leg, connected to selectably source current from said positive reference voltage to said load device;
    said first phase leg comprising a high-side switch and a low-side switch wherein said high-side switch is an N-channel depletion-mode power device; and
    said second phase leg comprising a high-side switch and a low-side switch, wherein said high-side switch is an N-channel depletion-mode power device.

18. The circuit of claim 17, wherein said N-channel depletion-mode power devices are DMOS.

19. The circuit of claim 17, wherein said high-side switches have gate drive voltages that are negative with respect to their sources.

20. The circuit of claim 17, wherein said first and second phase legs are incorporated in a single integrated circuit.

21. The circuit of claim 17, further comprising a microprocessor functionally connected to operate said high-side and low-side switches.

* * * * *